(12) United States Patent
Li et al.

(10) Patent No.: US 9,779,997 B2
(45) Date of Patent: Oct. 3, 2017

(54) SEMICONDUCTOR DEVICE AND A METHOD FOR FABRICATING THE SAME

(71) Applicant: TAIWAN SEMICONDUCTOR MANUFACTURING CO., LTD., Hsinchu (TW)

(72) Inventors: Po-Hsueh Li, Taichung (TW); Chih-Yang Yeh, Jhubei (TW); Chun-Chan Hsiao, Hsinchu (TW); Kuan-Lin Yeh, Hsinchu (TW); Yuan-Sheng Huang, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/068,409

(22) Filed: Mar. 11, 2016

(65) Prior Publication Data
US 2017/0194209 A1    Jul. 6, 2017

Related U.S. Application Data

(60) Provisional application No. 62/273,706, filed on Dec. 31, 2015.

(51) Int. Cl.
| | |
|---|---|
| *H01L 27/088* | (2006.01) |
| *H01L 21/8234* | (2006.01) |
| *H01L 29/49* | (2006.01) |
| *H01L 29/423* | (2006.01) |
| *H01L 29/66* | (2006.01) |

(52) U.S. Cl.
CPC ........ *H01L 21/823456* (2013.01); *H01L 21/823431* (2013.01); *H01L 27/0886* (2013.01); *H01L 29/42376* (2013.01); *H01L 29/4966* (2013.01); *H01L 29/66545* (2013.01)

(58) Field of Classification Search
CPC ........ H01L 21/823456; H01L 27/0086; H01L 21/823431
USPC ........................................ 257/401
See application file for complete search history.

(56) References Cited

U.S. PATENT DOCUMENTS

| | | | |
|---|---|---|---|
| 9,209,273 B1* | 12/2015 | Lin | ...... H01L 29/4232 |
| 9,431,296 B2* | 8/2016 | Basker | ...... H01L 21/76846 |
| 2012/0139061 A1* | 6/2012 | Ramachandran | . H01L 21/76895 257/410 |

(Continued)

*Primary Examiner* — David Vu
*Assistant Examiner* — Brandon Fox
(74) *Attorney, Agent, or Firm* — McDermott Will & Emery LLP

(57) ABSTRACT

In a method of manufacturing a semiconductor device, a dummy gate structure is formed over a substrate. A first insulating layer is formed over the dummy gate structure. The dummy gate structure is removed so as to form a gate space in the first insulating layer. A first conductive layer is formed in the gate space so as to form a reduced gate space. The reduced gate space is filled with a second conductive layer made of a different material from the first conductive layer. The filled first conductive layer and the second conductive layer are recessed so as to form a first gate recess. A third conductive layer is formed over the first conductive layer and the second conductive layer in the first gate recess. After recessing the filled first conductive layer and the second conductive layer, the second conductive layer protrudes from the first conductive layer.

19 Claims, 13 Drawing Sheets

(56) References Cited

U.S. PATENT DOCUMENTS

| | | | | |
|---|---|---|---|---|
| 2013/0187236 A1* | 7/2013 | Xie | ...................... | H01L 29/4966 |
| | | | | 257/369 |
| 2014/0008720 A1* | 1/2014 | Xie | ....................... | H01L 27/092 |
| | | | | 257/331 |
| 2015/0145057 A1* | 5/2015 | Fan | ....................... | H01L 27/092 |
| | | | | 257/369 |

* cited by examiner

SEMICONDUCTOR DEVICE AND A METHOD FOR FABRICATING THE SAME

CROSS-REFERENCE TO RELATED APPLICATIONS

This application claims priority to U.S. Provisional Patent Application 62/273,706 filed Dec. 31, 2015, the entire disclosure of which is incorporated herein by reference.

TECHNICAL FIELD

The disclosure relates to a method for manufacturing a semiconductor device, and more particularly to a structure and a manufacturing method for a metal gate structure.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET) and the use of a metal gate structure with a high-k (dielectric constant) material. The metal gate structure is often manufactured by using gate replacement technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 1A-15 show exemplary sequential manufacturing process of a semiconductor device according to one embodiment of the present disclosure.

FIGS. 1B-24 are cross sectional views corresponding to line X1-X1 of FIG. 1A.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of."

FIGS. 1A-15 show exemplary sequential manufacturing process of a semiconductor device according to one embodiment of the present disclosure. FIGS. 1B-15 are cross sectional views corresponding to line X1-X1 of FIG. 1A. It is understood that additional operations can be provided before, during, and after processes shown by FIGS. 1A-15, and some of the operations described below can be replaced or eliminated for additional embodiments of the method. The order of the operations/processes may be interchangeable.

Figure 1A:
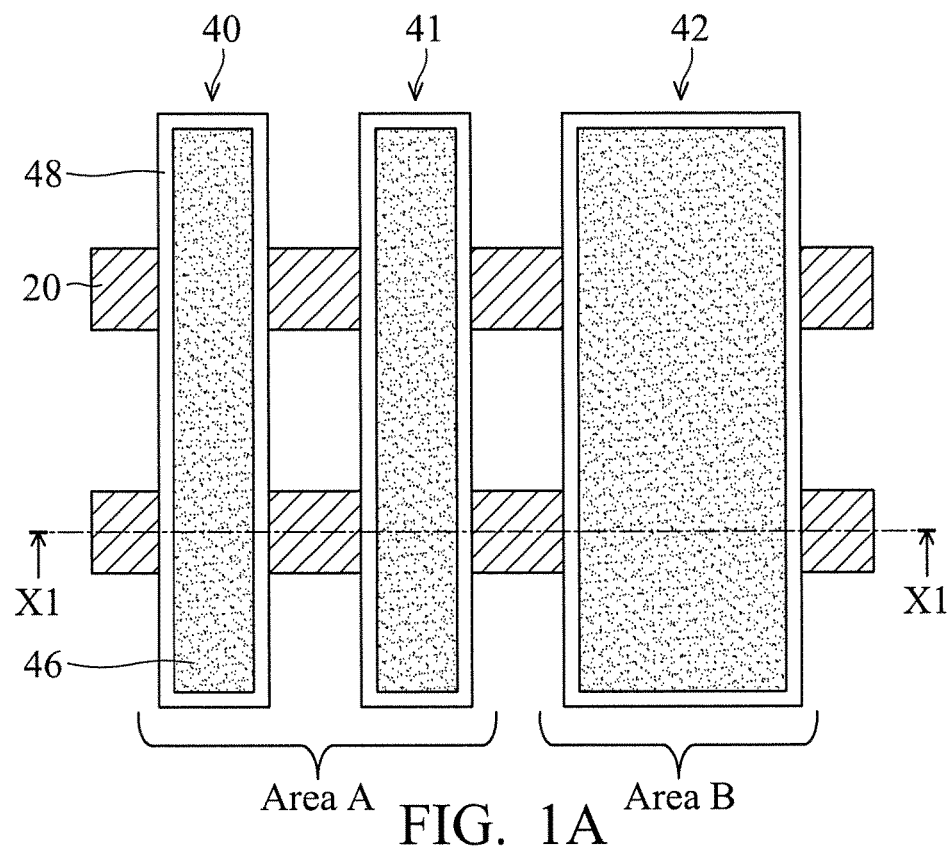
Figure 1B:
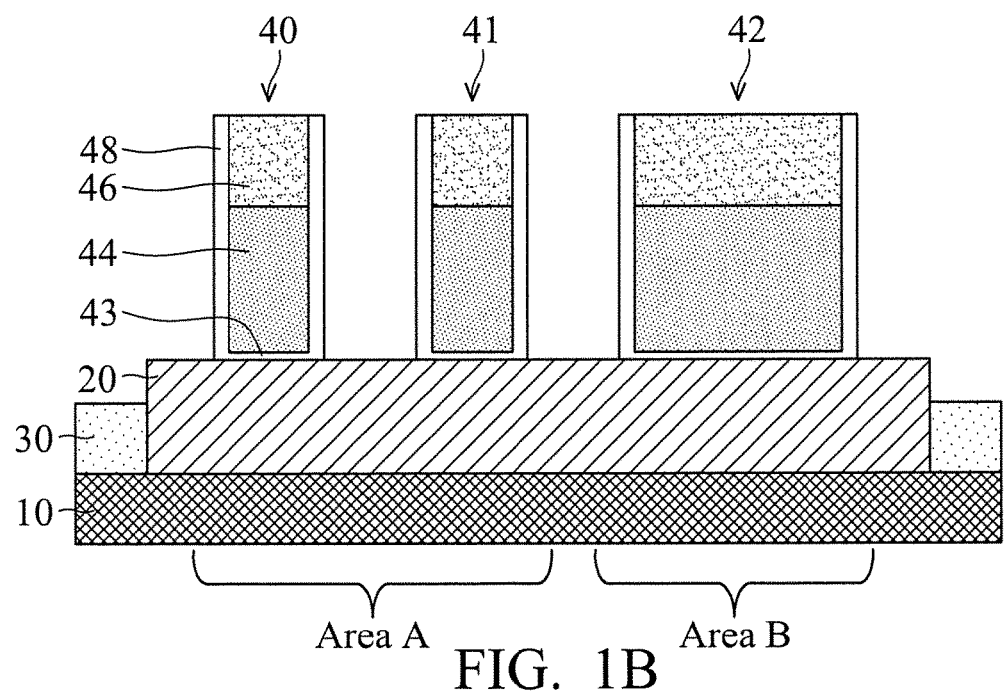

FIG. 1A shows a top view (plan view) of a structure of a semiconductor device after dummy gate structures are formed over a substrate. In FIGS. 1A and 1B, dummy gate structures 40, 41 and 42 are formed over a channel layer, for example, a part of a fin structure 20. Each of the dummy gate structures 40, 41 correspond to short-channel FETs having a gate length Lg1 and the dummy gate structure 42 corresponds to a long channel FET having a gate length Lg2, where Lg1<Lg2. In some embodiments, Lg1 is less than about 30 nm. The short-channel FETs are disposed in Area A and the long-channel FET is formed in Area B. Although the dummy gate structures 40, 41 and 42 are arranged adjacent to each other in FIGS. 1A and 1B, the arrangement is not limited to this. The dummy gate structures 40, 41 and 42 are formed separately with a distance in some embodiments.

The fin structure 20 is formed over a substrate 10 and extends from an isolation insulating layer 30. For explanation purpose, the dummy gate structures 40, 41 and 42 are formed over the same fin structure 20, but in some embodiments, dummy gate structures 40, 41 and 42 are formed over different fin structures, respectively. Similarly, although two fin structures 20 are illustrated in FIG. 1A, the number of fin structure per one gate structure is not limited to two, and may be one, or three or more.

The substrate 10 is, for example, a p-type silicon substrate with an impurity concentration in a range from about $1\times10^{15}$ $cm^{-3}$ to about $1\times10^{18}$ $cm^{-3}$. In other embodiments, the substrate is an n-type silicon substrate with an impurity concentration in a range from about $1\times10^{15}$ $cm^{-3}$ to about $1\times10^{18}$ $cm^{-3}$. Alternatively, the substrate may comprise another elementary semiconductor, such as germanium; a compound semiconductor including Group IV-IV compound semiconductors such as SiC and SiGe, Group III-V compound semiconductors such as GaAs, GaP, GaN, InP, InAs, InSb, GaAsP, AlGaN, AnnAs, AlGaAs, GaInAs, GaInP, and/or GaInAsP; or combinations thereof. In one embodiment, the substrate is a silicon layer of an SOI (silicon-on insulator) substrate.

The fin structures 20 may be formed by trench-etching the substrate. After forming the fin structures 20, the isolation insulating layer 30 is formed over the fin structures 20. The isolation insulating layer 30 includes one or more layers of insulating materials such as silicon oxide, silicon oxynitride or silicon nitride, formed by LPCVD (low pressure chemical vapor deposition), plasma-CVD or flowable CVD. The isolation insulating layer may be formed by one or more layers of spin-on-glass (SOG), SiO, SiON, SiOCN and/or fluorine-doped silicate glass (FSG).

After forming the isolation insulating layer 30 over the fin structures 20, a planarization operation is performed so as to remove part of the isolation insulating layer 30. The planarization operation may include a chemical mechanical polishing (CMP) and/or an etch-back process. Then, the isolation insulating layer 30 is further removed (recessed) so that the upper regions of the fin structures 20 are exposed.

Then, the dummy gate structures 40, 41 and 42 are formed over the exposed fin structures 20. The dummy gate structure includes a dummy gate electrode layer 44 made of poly silicon and a dummy gate dielectric layer 43. Sidewall spacers 48 including one or more layers of insulating materials are also formed on sidewalls of the dummy gate electrode layer. The sidewall spacers 48 include one or more layers of insulating material such as silicon nitride based material including SiN, SiON, SiCN and SiOCN. The film thickness of the sidewall spacers 48 at the bottom of the sidewall spacers is in a range from about 3 nm to about 15 nm in some embodiments, and is in a range from about 4 nm to about 8 nm in other embodiments.

The dummy gate structures further include a mask insulating layer 46, which is used to pattern a poly silicon layer into the dummy gate electrode layers. The thickness of the mask insulating layer 46 is in a range from about 10 nm to about 30 nm in some embodiments, and is in a range from about 15 nm to about 20 nm in other embodiments.

Figure 2:
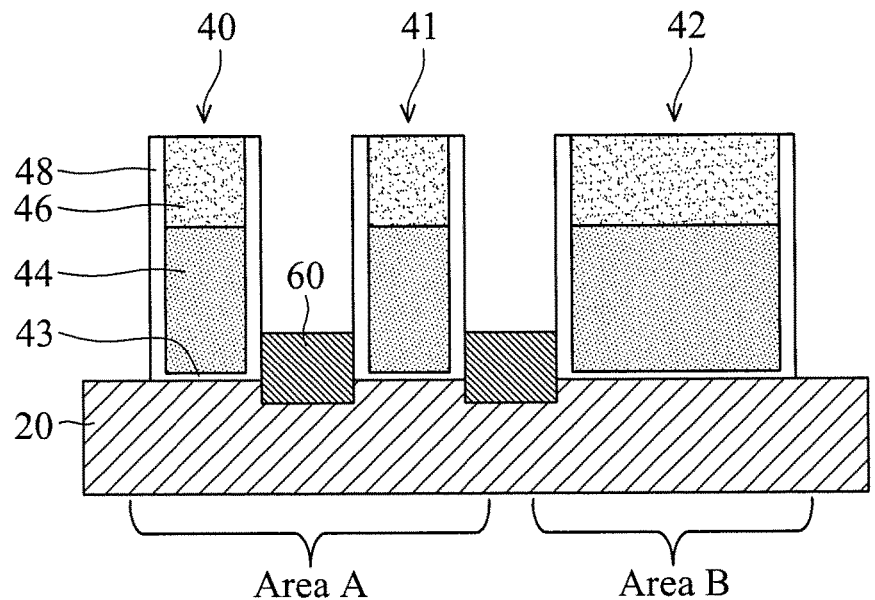

As shown in FIG. 2, after the dummy gate structures are formed, source/drain regions 60 are formed. In the present disclosure, a source and a drain are interchangeably used, and the term source/drain refers to either one of a source and a drain. In some embodiments, the fin structure 20 not covered by the dummy gate structures is recessed below the upper surface of the isolation insulating layer 30. Then, the source/drain regions 60 are formed over the recessed fin structure by using an epitaxial growth method. The source/drain regions 60 may include a strain material to apply stress to the channel region. Additional source/drain regions 60 may be formed at the left of the dummy gate structure 40 and/or at the right of the dummy gate structure 42.

Figure 3:
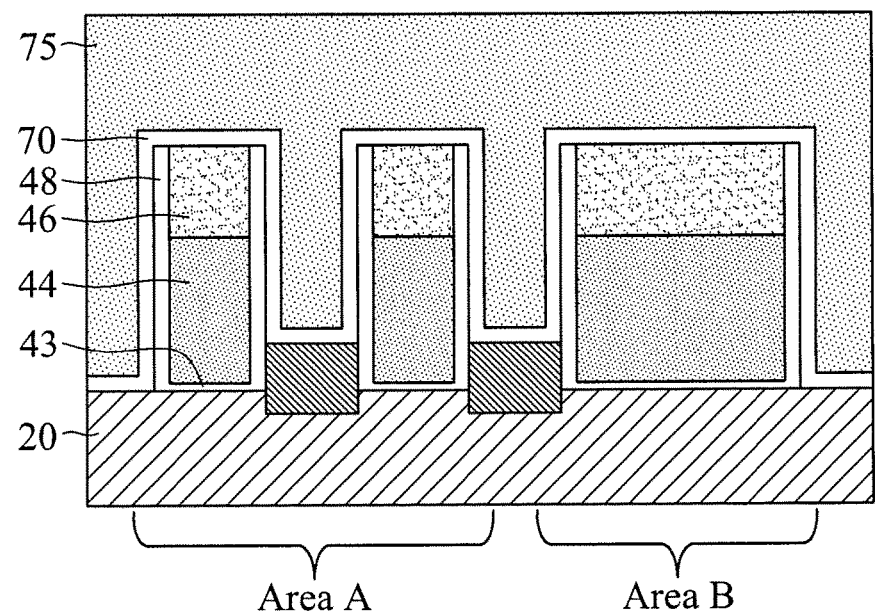

Then, as shown in FIG. 3, a first etching stop layer (ESL) 70 and a first interlayer insulating (ILD) layer 75 are formed over the dummy gate structures and the source/drain regions. The first ESL 70 includes one or more layers of insulating material such as silicon nitride based material including SiN, SiCN and SiOCN. The thickness of the first ESL 70 is in a range from about 3 nm to about 10 nm in some embodiments. The first ILD layer 75 includes one or more layers of insulating material such as silicon oxide based material such as silicon dioxide ($SiO_2$) and SiON.

Figure 4:
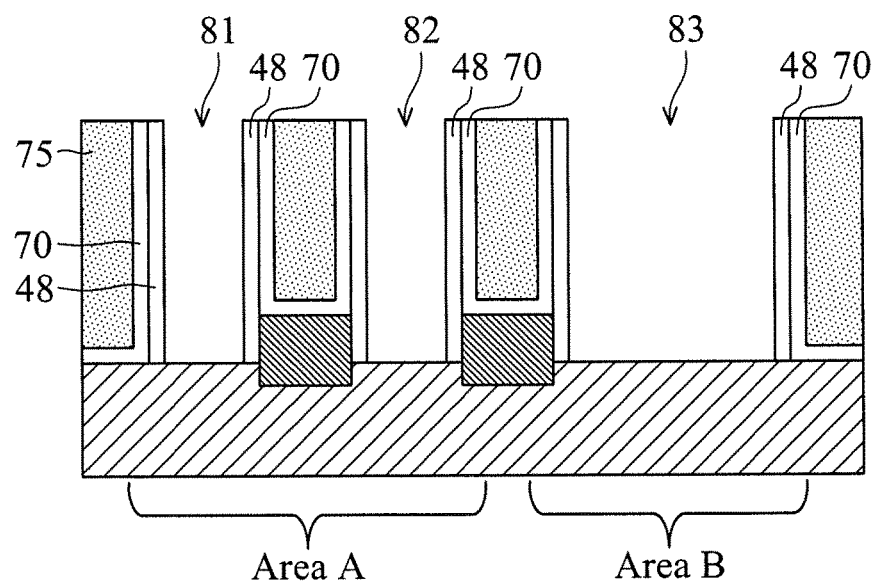

After a planarization operation on the first ILD layer 75 and the ESL 70, the dummy gate structures are removed so as to make gate spaces 81, 82 and 83, as shown in FIG. 4. As shown in FIG. 4, the gate sidewall spacers 48 remain in the gate spaces.

Figure 5:
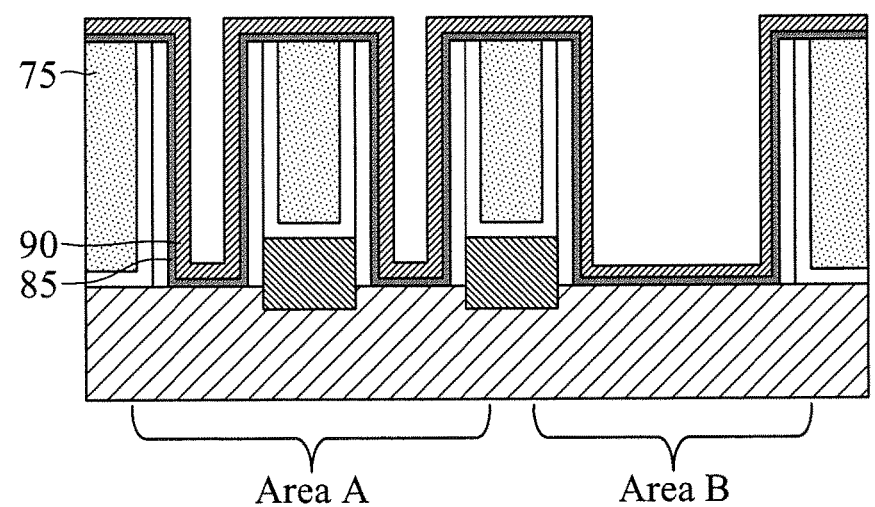

Then, as shown in FIG. 5, a gate dielectric layer 85 is formed. The gate dielectric layer 85 includes one or more layers of dielectric material, such as a high-k metal oxide. Examples of the metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, an interfacial layer (not shown) made of, for example, silicon oxide, is formed over the fin structure (channel region) before forming the gate dielectric layer 85. A blanket layer of a suitable dielectric material is formed over the gate spaces and the first ILD layer 75, by using CVD, PVD, ALD or other suitable film forming methods.

Further, a work function adjustment (WFA) layer 90 for a p-channel FET is formed in the gate spaces 81, 82 and 83. A blanket layer of a suitable conductive material is formed over the gate spaces and the first ILD layer 75. The WFA layer 90 includes one or more layers of conductive material. Examples of the WFA layer 90 for a p-channel FET include Ti, TiAlC, Al, TiAl, TaN, TaAlC, TiN, TiC and Co. In one embodiment, TiN is used for a p-channel FET. Examples of the WFA layer 90 for an n-channel FET include TiN, TaN, TaAlC, TiC, TiAl, TaC, Co, Al, TiAl, HfTi, TiSi, TaSi or TiAlC. In one embodiment, TaAlC, TiAl or Al is used for an n-channel FET. The thickness of the WFA layer 90 is in a range from about 3 nm to about 10 nm in some embodiments. The WFA layer 90 may be formed by chemical vapor deposition (CVD), physical vapor deposition (PVD) including sputtering, atomic layer deposition (ALD) or other suitable method. As shown in FIG. 5, the WFA layer 90 is conformally formed in the gate spaces.

Figure 6:
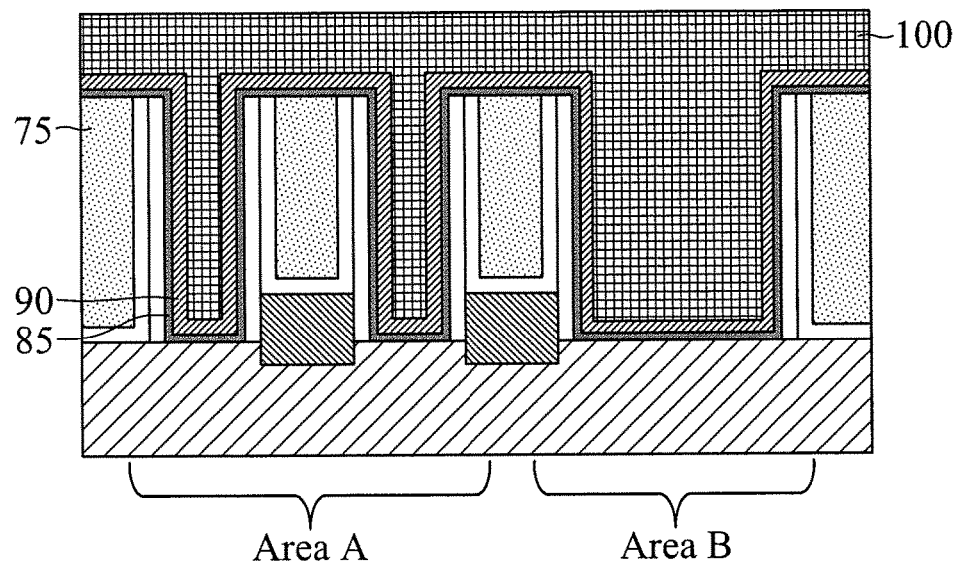

Then, as shown in FIG. 6, a first metal material 100 is formed over the structure of FIG. 5. The first metal material includes one or more layers of metal material, such as Al, Co, Cu, W, Ti, Ta, TiN, TiAl, TiAlC, TiAlN, TaN, NiSi, CoSi, other conductive materials. In one embodiment, W, Co or Al is used. The first metal material is formed by CVD, PVD, ALD, electroplating or other suitable methods. The first metal material 100 is made of a different material than the WFA layer 90.

Figure 7:
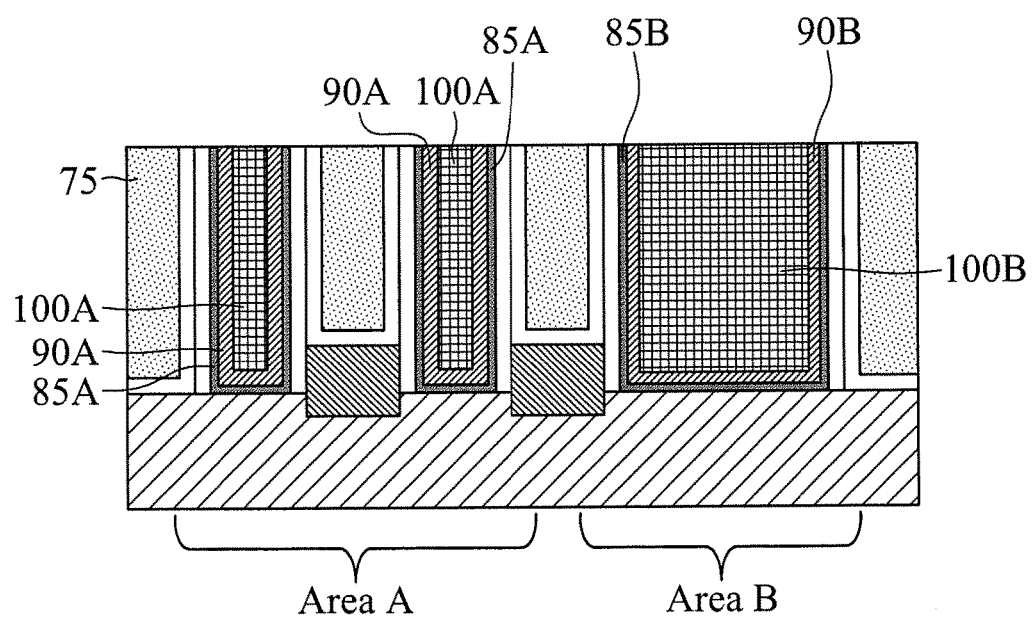

Then, as shown in FIG. 7, a planarization operation is performed so as to remove the upper portion of the deposited first metal material 100. After the planarization operation, the first conductive layer 100A for a metal gate electrode of a short channel FET and the first conductive layer 100B for a metal gate electrode of a long channel FET are formed in each of the gate spaces. The short channel FETs in Area A also include a gate dielectric layer 85A and a WFA layer 90A, and the long channel FET in Area B also includes a gate dielectric layer 85B and a WFA layer 90B. The planarization operation may include a chemical mechanical polishing (CMP) and/or an etch-back process.

Figure 8:
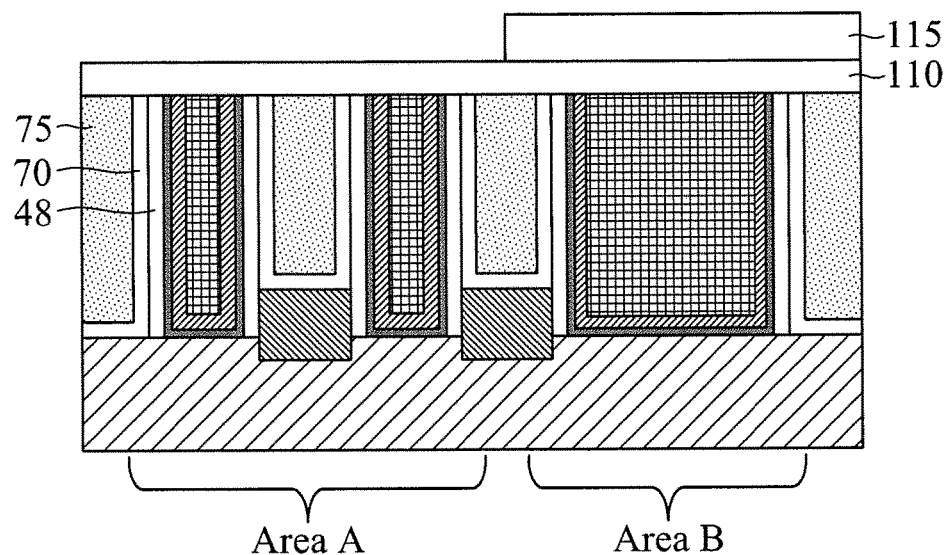

Subsequently, a protective layer 110 is formed over the structure of FIG. 7 and a mask pattern 115 is formed so as to cover Area B for the long channel FET, as shown in FIG. 8. The protective layer 110 includes one or more layers of insulating material, such as SiN. The mask pattern 115 is a photo resist pattern in some embodiments.

Figure 9A:
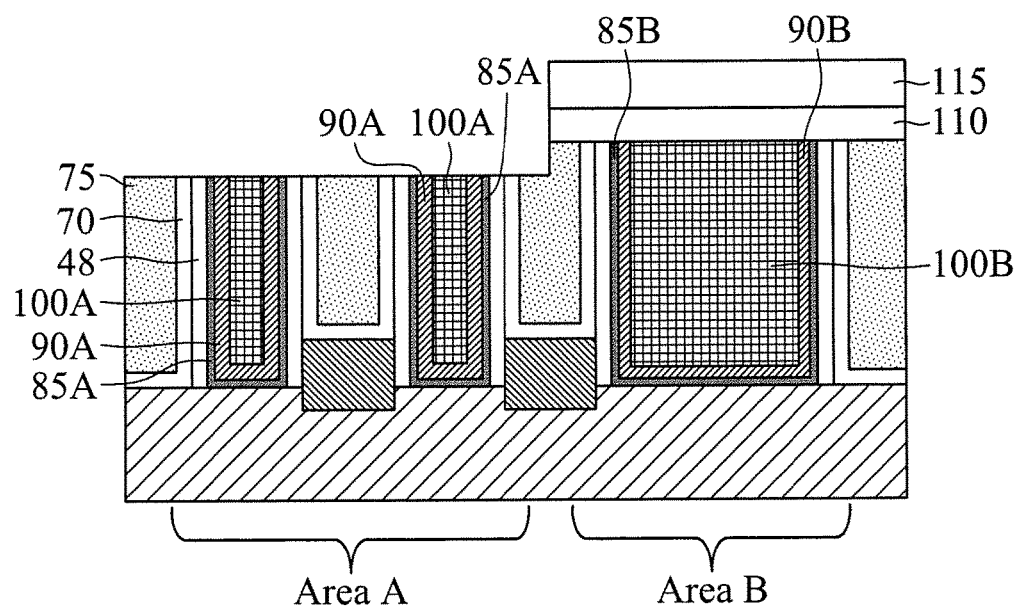
Figure 9B:
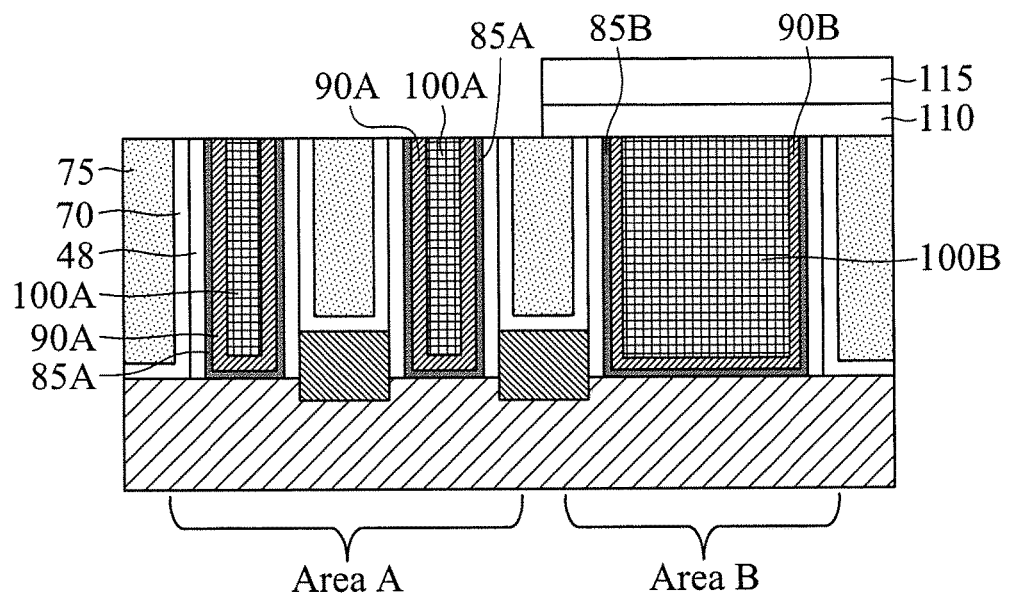

By using the mask pattern 115 as an etching mask, the protective layer 110 is patterns to open an area above Area A. Then, by using the patterned protective layer 110 as an etching mask, the upper portion of the first conductive layer 100A, the gate dielectric layer 85A, the WFA layer 90A, the sidewall spacers 48, the first ESL 70 and the first ILD layer 75 are recessed, as shown in FIG. 9A. In some embodiments, the mask pattern 115 remains on the protective layer 110. In other embodiments, the upper portion of the first conductive layer 100A, the gate dielectric layer 85A, the WFA layer 90A, the sidewall spacers 48, the first ESL 70 and the first ILD layer 75 are not substantially recessed, as shown in FIG. 9B.

Figure 10:
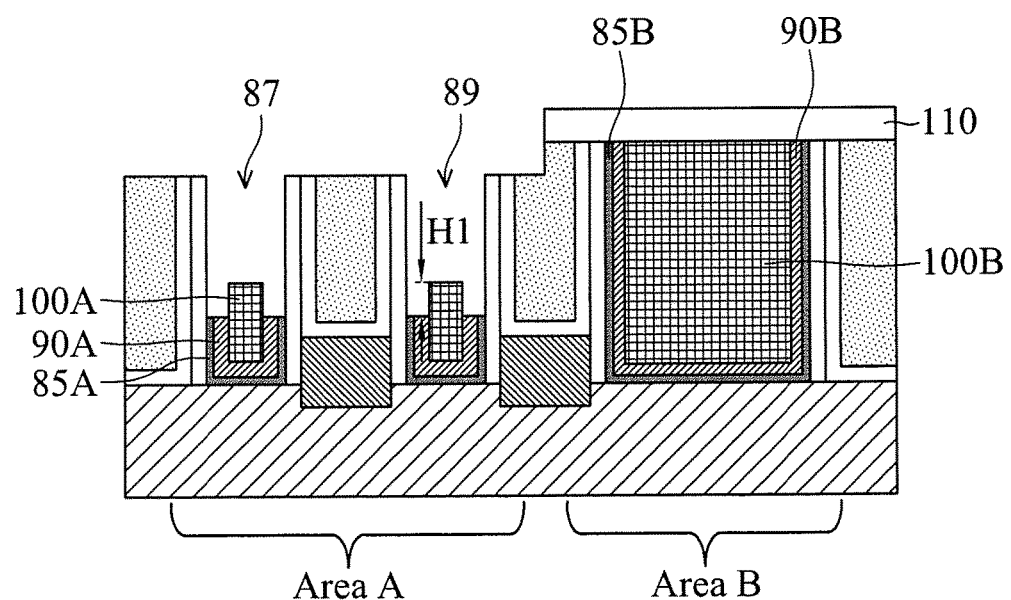

After the recess etching of Area A, the first conductive layers 100A and the WFA layers 90A are recessed (etched-back) to form gate recesses 87 and 89, as shown in FIG. 10. Since the materials for the first conductive layers 100A and the WFA layer 90A are different, the etching amount (depth) of the first conductive layers 100A and the WFA layer 90A are different. For example, when the first conductive layers 100A is made of W and the WFA layer 90A are made of TiN or an aluminum-containing material (TiAl, TaAlC or Al), the WFA layer 90A are etched more than the first conductive layer 100A. As a result, the first conductive layer 100A protrudes from the WFA layer 90A, as shown in FIG. 10. The amount H1 of the protrusion is in a range from about 10 nm to about 50 nm in some embodiments. The gate dielectric layers 85A are also etched (recessed) by an additional etching operation. In other embodiments, the gate dielectric layers 85A are not etched (recessed).

Figure 11:
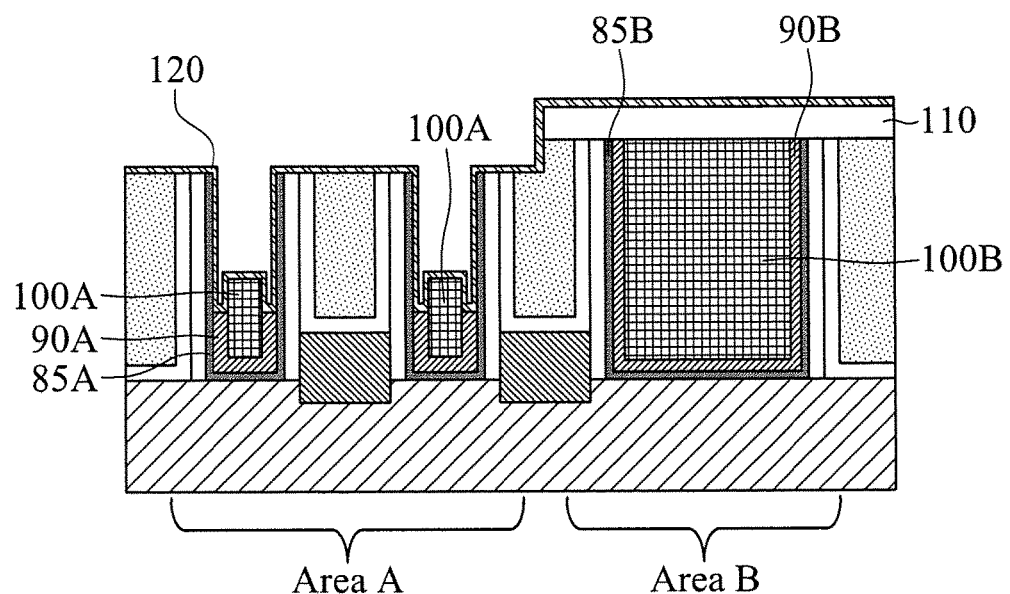
Figure 12:
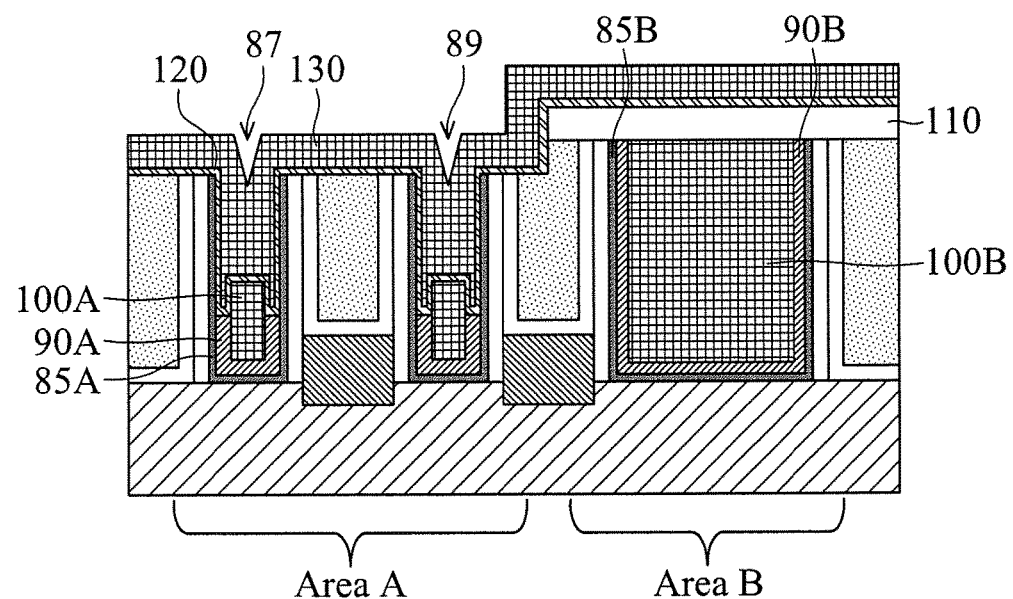

Then, as shown in FIG. 11, a blanket layer of a second metal material 120 is conformally formed over the structure of FIG. 10. Subsequently, a third metal material layer 130 is formed over the second metal material layer 120, as shown in FIG. 12. The third metal material layer 130 includes the one or more of Al, Co, Cu, W, Ti, Ta, TiN, TiAl, TiAlC, TiAlN, TaN, NiSi, CoSi, other conductive materials. In one embodiment, W, Co or Al is used. In this embodiment, the third metal material layer 130 is made of the same material as the first conductive layer 100. The second conductive layer 120 functions as a glue layer for the third conductive layer 130, and includes one or more layers of TiN, Ti or TaN. The second and third metal material is formed by CVD, PVD, ALD, electroplating or other suitable methods.

Figure 13:
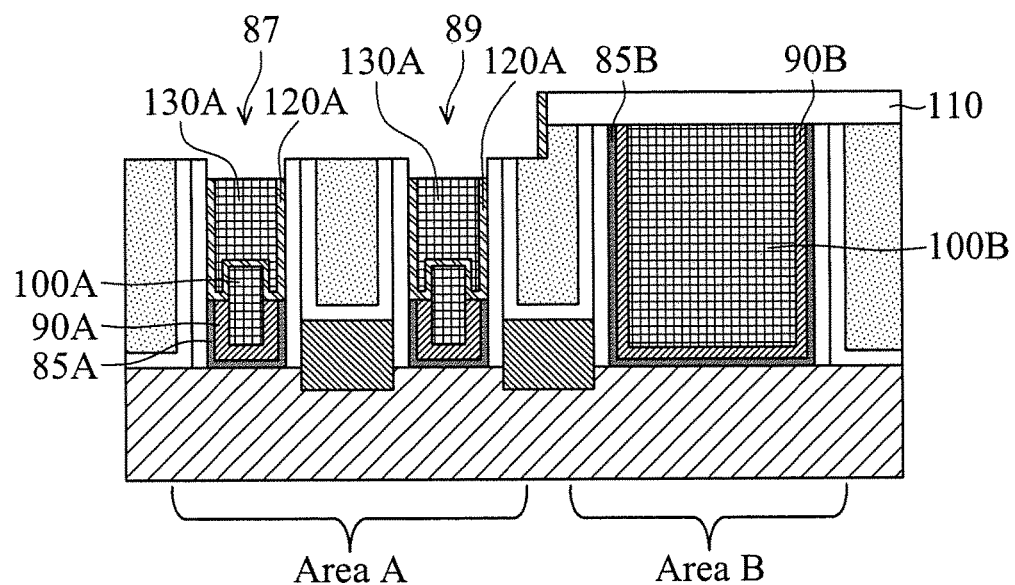

Subsequently, an etch-back operation is performed on the third conductive layer 130. By the etch-back operation, the third conductive layers 130A are formed in the gate recesses 87, 89 and the third conductive layer formed over Area B is removed, as shown in FIG. 13. In the etch-back operation, the second metal material 120 is also removed, thereby forming second conductive layers 120A.

Figure 14:
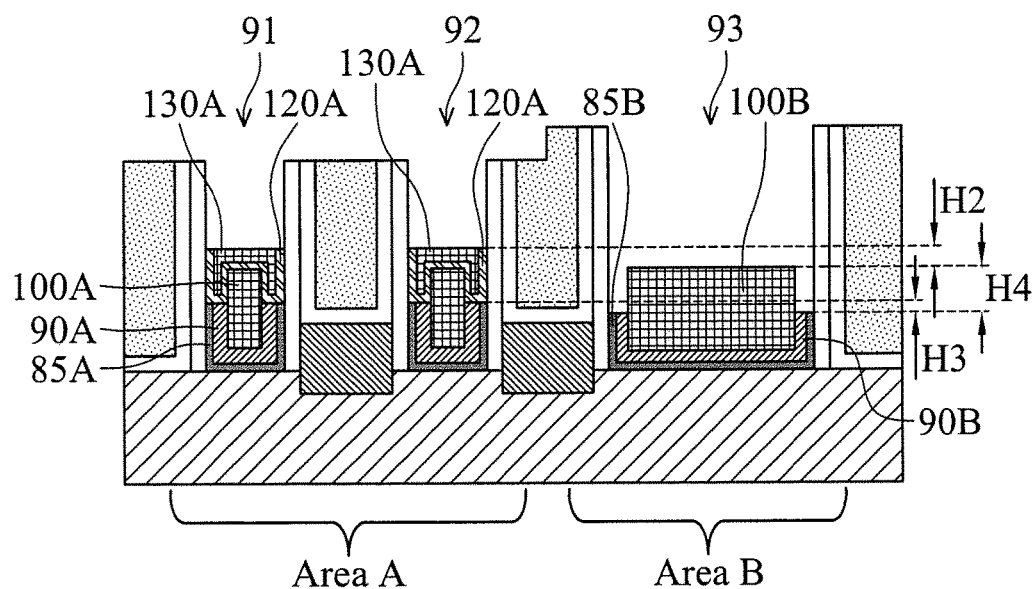

As shown in FIG. 14, the mask layer 110 is removed, and then an etch-back operation is again performed to recess the third conductive layers 130A in the first Area A, thereby forming first gate recesses 91, 92 and the first conductive layer 100B in the second Area B, thereby forming a second gate recess 93. In the etch-back operation, the gate dielectric layer 85B and the WFA layer 90B in the second area B are also recessed. In some embodiments, the gate dielectric layer 85B is not etched (recessed).

As shown in FIG. 14, the first conductive layer 100B protrudes from the WFA layer 90B by an amount of H4 since the materials for the first conductive layer 100B and the WFA layer 90B are different, and the etching amount (depth) of the first conductive layers 100B and the WFA layer 90B are different. In some embodiments, H4 is less than about ±50 nm.

In some embodiments, a height of the recessed third conductive layer 130A measured from the substrate is different from a height of the recessed first conductive layer 100B by an amount of H2. In some embodiments, H2 is less than about ±60 nm. In some embodiments, the height of the recessed first conductive layer 100B is greater than the height of the recessed third conductive layer 130A, and in other embodiments, the height of the recessed first conductive layer 100B is smaller than the height of the recessed third conductive layer 130A.

Similarly, a height of the WFA layer 90A in Area A measured from the substrate is different from a height of the WFA layer 90B in Area B by an amount of H3. In some embodiments, H3 is less than about ±60 nm. In some embodiments, the height of the WFA layer 90A is greater than the height of the height of the WFA layer 90B, and in other embodiments, the height of the WFA layer 90A is smaller than the height of the WFA layer 90B.

Figure 15:
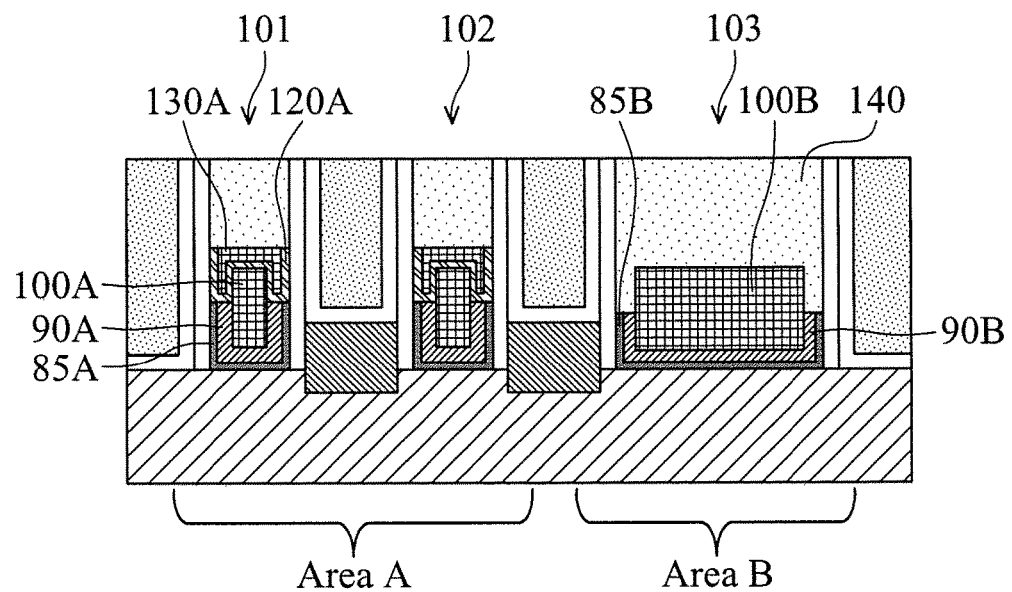

Further, as shown in FIG. 15, the gate recesses 91, 92 and 93 are filled by a second insulating layer 140. A blanket layer of a second insulating material is formed and a planarization operation, such as a CMP process, is performed. The second insulating layer 140 includes one or more layers of insulating material such as silicon nitride based material including SiN, SiCN and SiOCN.

As shown in FIG. 15, short channel FETs 101, 102 include a first gate dielectric layer 85A and a first gate electrode. The first gate electrode includes a WFA layer 90A (underlying conductive layer) in contact with the first gate dielectric layer 85A and a first conductive layer 100A (bulk conductive layer). The first gate electrode further includes a third conductive layer 130A (upper conductive layer) and a second conductive layer 120A (intermediate conductive layer) disposed between the first conductive layer 100A and the third conductive layer 130A. The first conductive layer 100A protrudes from the WFA layer 90A. An insulating layer 140 is provided in contact with the third conductive layer 130A.

A long channel FET 103 includes a second gate dielectric layer 85B and a second gate electrode. The second gate electrode includes a WFA layer 90B in contact with the second gate dielectric layer 85B and a first conductive layer 100B. An insulating layer 140 is provided in contact with an upper surface of the WFA layer 90B and the first conductive layer 100B.

FIGS. 16-20 show exemplary sequential manufacturing process of a semiconductor device according to another embodiment of the present disclosure. FIGS. 16-20 are cross sectional views corresponding to line X1-X1 of FIG. 1A. It is understood that additional operations can be provided before, during, and after processes shown by FIGS. 16-20, and some of the operations described below can be replaced or eliminated for additional embodiments of the method. The order of the operations/processes may be interchangeable. Further, The same of similar configuration, structure, materials, operations or processes of the foregoing embodiments may be employed in this embodiment and the detailed explanation may be omitted.

In this embodiment, an n-type short channel FET, an n-type long channel FET and a p-type short channel FET are formed in Area A, Area B and Area C, respectively.

Figure 16:
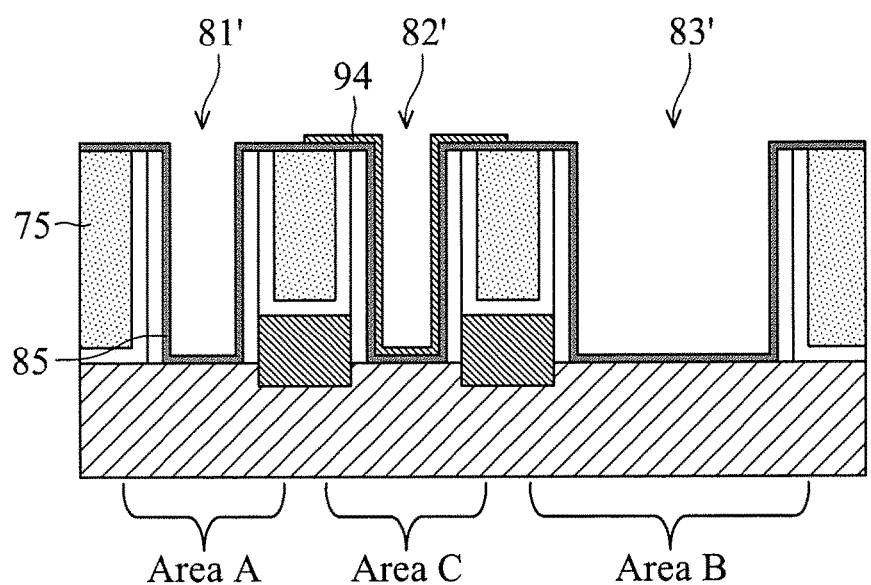
FIGS. 16-20 show exemplary sequential manufacturing process of a semiconductor device according to another embodiment of the present disclosure.

After the dummy gate structures are removed similar to FIG. 4, a gate dielectric layer 85 is formed in the gate space 81', 82', and 83', as shown in FIG. 16. Further, a first work function adjustment (WFA) layer 92 for a p-channel FET is formed in the gate space 82' in Area C, as shown in FIG. 16.

A blanket layer of a suitable conductive material is formed over the gate spaces and the first ILD layer 75, and a patterning operation including lithography and etching is performed to form the first WFA layer 92 for a p-channel FET in the gate space 82' (and the surrounding area). The first WFA layer 92 includes one or more layers of conductive material. Examples of the first WFA layer 92 for a p-channel FET include Ti, TiAlC, Al, TiAl, TaN, TaAlC, TiN, TiC and Co. In one embodiment, Ti is used. The thickness of the first WFA layer 92 is in a range from about 3 nm to about 10 nm in some embodiments. The first WFA layer 92 may be formed by chemical vapor deposition (CVD), physical vapor deposition (PVD) including sputtering, atomic layer deposition (ALD) or other suitable method. As shown in FIG. 16, the first WFA layer 92 is conformally formed in the gate space 82'.

Figure 17:
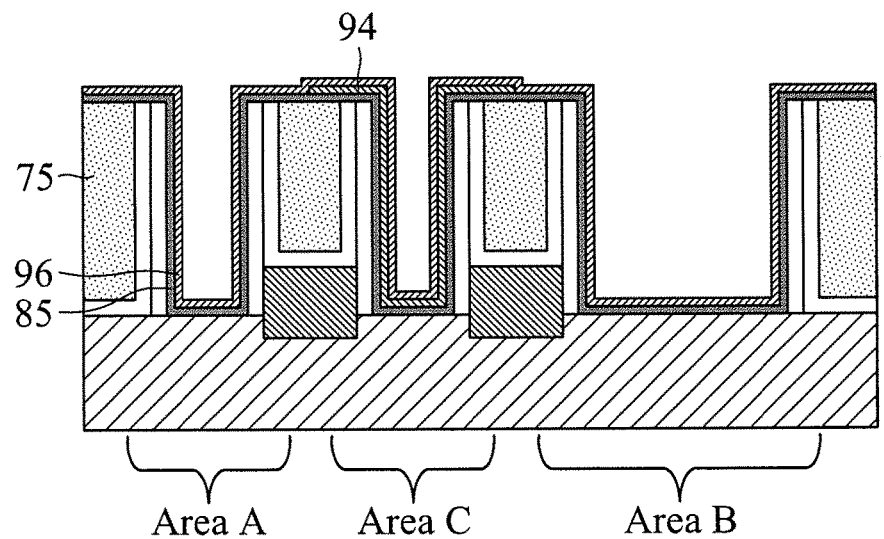

Then, as shown in FIG. 17, a second WFA layer 94 for n-channel FETs is formed in the gate spaces 81' and 83'. A blanket layer of a suitable conductive material is formed over the gate spaces and the first WFA layer 92. The second WFA layer 94 includes one or more layer of conductive material. Examples of the second WFA layer 94 for an n-channel FET include TiN, TaN, TaAlC, TiC, TaC, Co, Al, TiAl, HfTi, TiSi, TaSi or TiAlC. In one embodiment, TiN is used. The thickness of the second WFA layer 94 is in a range from about 3 nm to about 10 nm in some embodiments. The second WFA layer 94 may be formed by chemical vapor deposition (CVD), physical vapor deposition (PVD) including sputtering, atomic layer deposition (ALD) or other suitable methods. As shown in FIG. 17, the second WFA layer 94 is conformally formed in the gate spaces 81' and 83'. It is noted that the order of forming the first WFA layer 92 and the second WFA layer 94 can be changed. The second WFA layer 94 is made of a different material than the first WFA layer 92.

Figure 18:
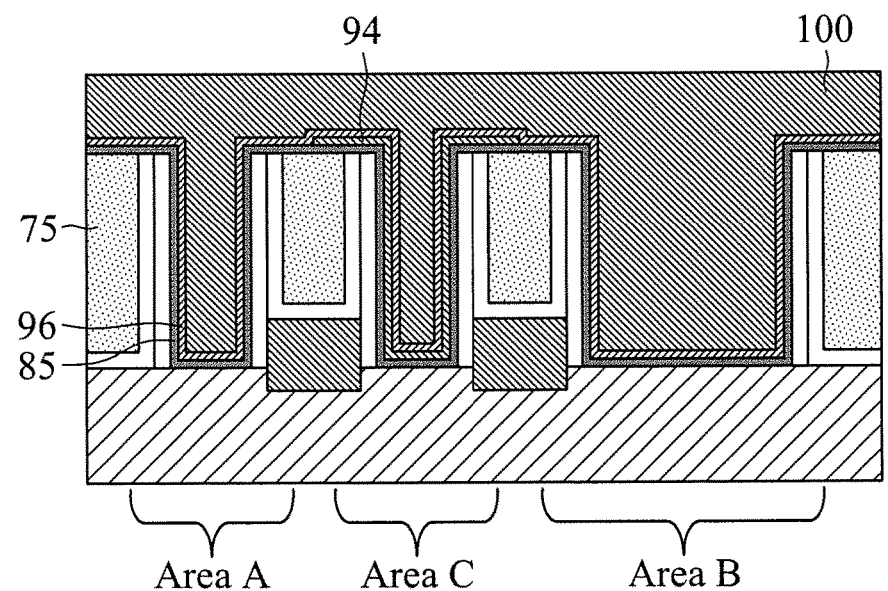

Subsequently, similar to FIG. 6, a first metal material 100 is formed over the structure of FIG. 17, as shown in FIG. 18. The first metal material 100 is made of a different material than at least one of the first WFA layer 92 and the second WFA layer 94.

Figure 19:
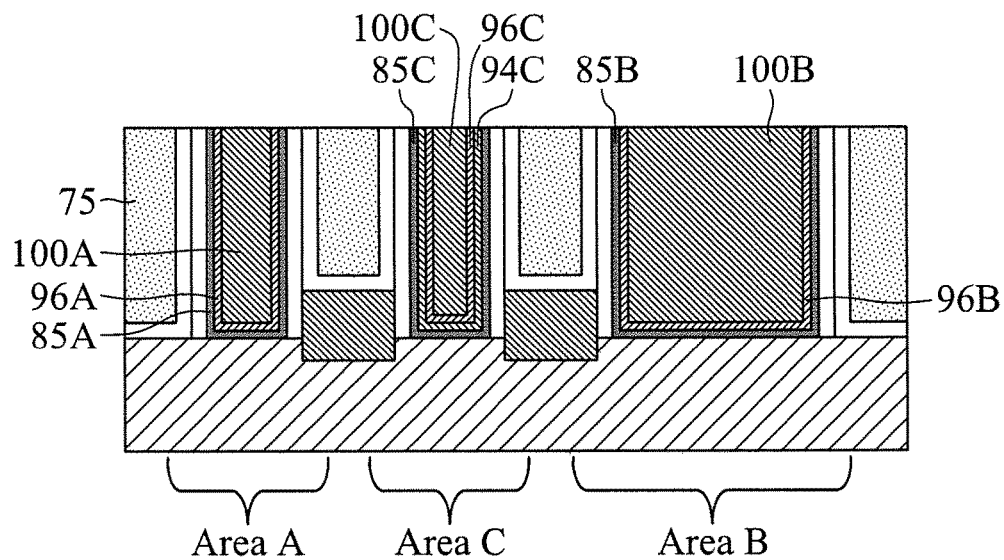

Then, as shown in FIG. 19, a planarization operation is performed so as to remove the upper portion of the deposited first metal material 100. After the planarization operation, the first conductive layer 100A for a metal gate electrode of an n-type short channel FET, the first conductive layer 100B for a metal gate electrode of an n-type long channel FET and the first conductive layer 100C for a metal gate electrode of a p-type short channel FET are formed in each of the gate spaces. The n-type short channel FET in Area A also includes a gate dielectric layer 85A and a second WFA layer 94A, the long channel FET in Area B also includes a gate dielectric layer 85B and a second WFA layer 94B, and the p-type short channel FET in Area C includes a gate dielectric layer 85C and a first WFA layer 92C and a second WFA layer 94C.

Figure 20:
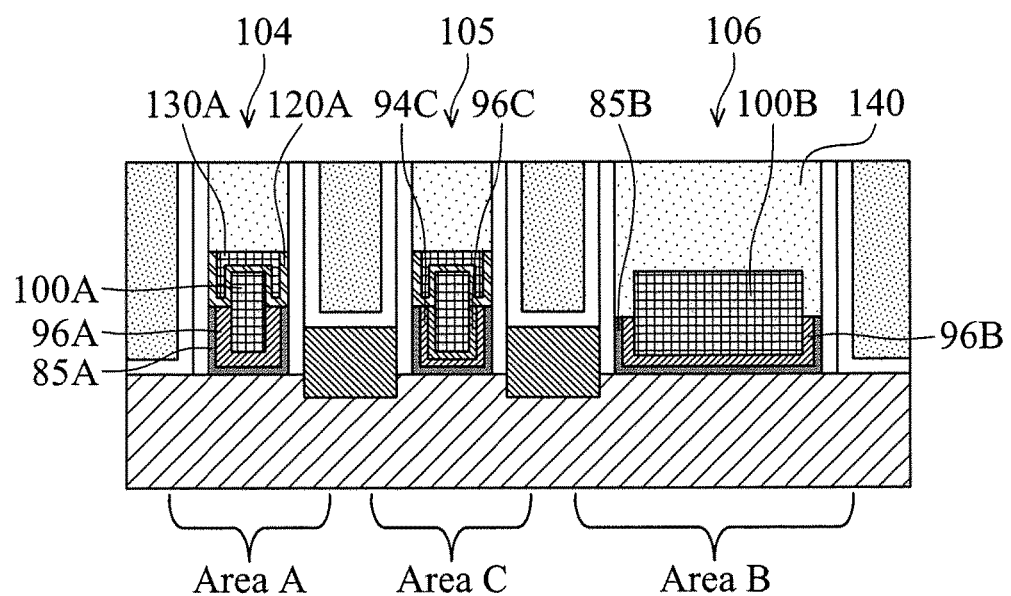

After the structure of FIG. 19 is formed, similar operations with respect to FIGS. 8-15 are performed, and the structure of FIG. 20 is obtained.

As shown in FIG. 20, an n-type short channel FET 104 includes a first gate dielectric layer 85A and a first gate electrode. The first gate electrode includes a second WFA layer 94A in contact with the first gate dielectric layer 85A and a first conductive layer 100A. Further, the first gate electrode includes a third conductive layer 130A and a second conductive layer 120A disposed between the first and second conductive layers 100A, 120A and the third conductive layer 130A. The first conductive layer 100A protrudes from the second conductive layer 120A. An insulating layer 140 is provided in contact with the third conductive layer 130A.

An n-type long channel FET 106 includes a second gate dielectric layer 85B and a second gate electrode. The second gate electrode includes a second WFA layer 94B in contact with the second gate dielectric layer 85B and a first conductive layer 100B. An insulating layer 140 is provided in contact with an upper surface of the second WFA layer 93B and the first conductive layer 100B.

A p-type short channel FET 105 includes a third gate dielectric layer 85C and a third gate electrode. The third gate electrode includes a first WFA layer 92C in contact with the first gate dielectric layer 85A, a second WFA layer 94C and a first conductive layer. Further, the third gate electrode includes a third conductive layer and a second conductive layer disposed between the first and second conductive layers and the third conductive layer, similar to the n-type short channel FET 104. The first conductive layer protrudes from the second conductive layer. An insulating layer 140 is provided in contact with the third conductive layer.

Figure 21:
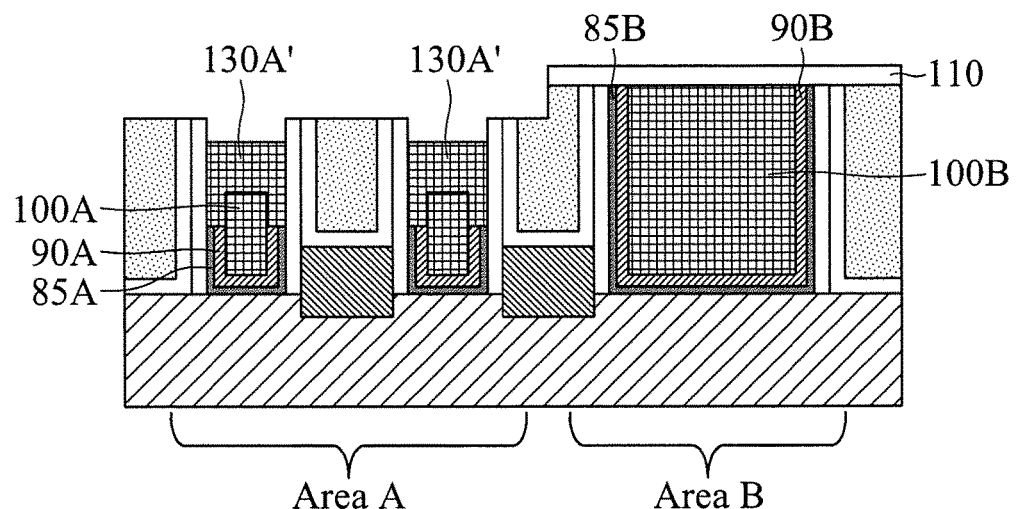
FIGS. 21-23 show exemplary sequential manufacturing process of a semiconductor device according to another embodiment of the present disclosure.
Figure 22:
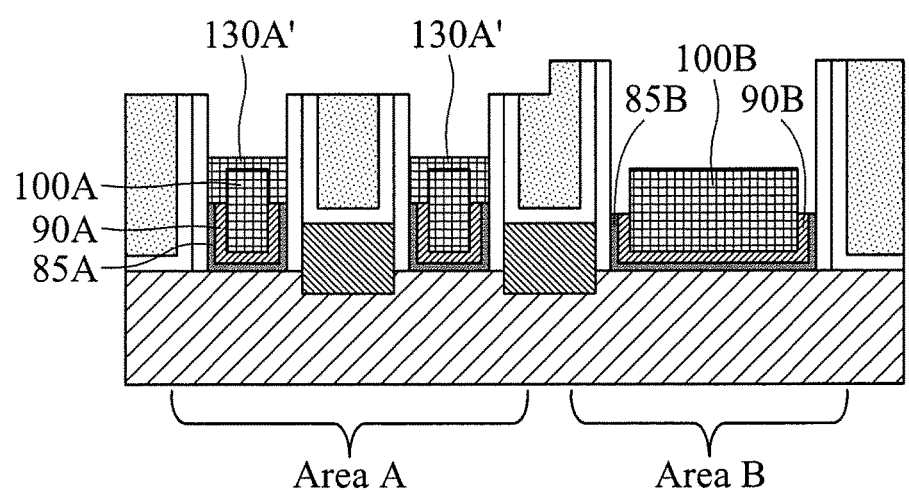
Figure 23:
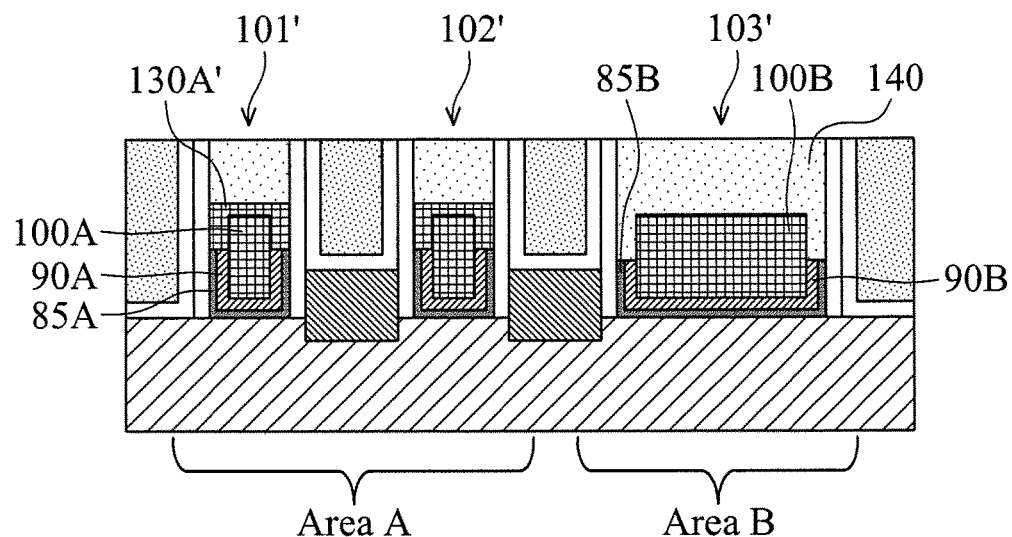

FIGS. 21-23 show exemplary sequential manufacturing process of a semiconductor device according to another embodiment of the present disclosure. FIGS. 21-23 are cross sectional views corresponding to line X1-X1 of FIG. 1A. It is understood that additional operations can be provided before, during, and after processes shown by FIGS. 21-23, and some of the operations described below can be replaced or eliminated for additional embodiments of the method. The order of the operations/processes may be interchangeable. Further, the same of similar configuration, structure, materials, operations or processes of the foregoing embodiments may be employed in this embodiment and the detailed explanation may be omitted.

After the structure of FIG. 10 is formed, as shown in FIG. 21, third conductive layers 130A' are formed over the first conductive layers 100A and the WFA layers 90A. In one embodiment, the third conductive layers 130A' include tungsten (W) formed by, for example, ALD using $WCl_5$ and $H_2$ as source gases. Generally, tungsten by ALD is selectively formed over a conductive surface and is not formed over an insulating surface. Accordingly, the third conductive layers 130A' made of W can be formed only on the first conductive layers 100A and the WFA layers 90A. By adjusting the deposition time, the third conductive layers 130A' with a required thickness can be formed.

After the structure of FIG. 21 is formed, similar operations with respect to FIG. 14 are performed, and the structure of FIG. 22 is obtained.

Further, similar operations with respect to FIG. 15 are performed, and the structure of FIG. 23 is obtained.

As shown in FIG. 23, short channel FETs 101', 102' include a first gate dielectric layer 85A and a first gate electrode. The first gate electrode includes a WFA layer 90A in contact with the first gate dielectric layer 85A and a first conductive layer 100A. Further, the first gate electrode includes a third conductive layer 130A'. The first conductive layer 100A protrudes from the second conductive layer 120A. An insulating layer 140 is provided in contact with the third conductive layer 130A'. When the first conductive layer 100A and the third conductive layer 130A' are made of a different material, an interface between these two layers can be observed. When the first conductive layer 100A and the third conductive layer 130A' are made of the same material (e.g., W), an interface between these two layers may not observed, and the combination of the first conductive layer 100A and the third conductive layer 130A' forms a T-shape in the cross section.

A long channel FET 103' includes a second gate dielectric layer 85B and a second gate electrode. The second gate electrode includes a WFA layer 90B in contact with the second gate dielectric layer 85B and a first conductive layer 100B. An insulating layer 140 is provided in contact with an upper surface of the WFA layer 90B and the first conductive layer 100B.

Figure 24:
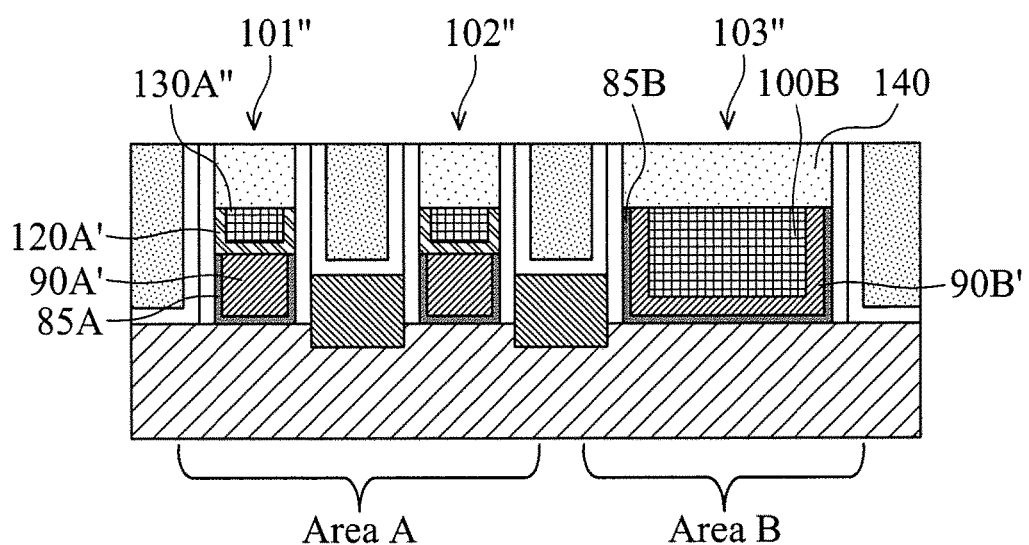
FIG. 24 shows an exemplary cross sectional view of a semiconductor device according to another embodiment of the present disclosure.

FIG. 24 shows an exemplary cross sectional view of a semiconductor device according to another embodiment of the present disclosure. The same or similar configuration, structure, materials, operations or processes of the foregoing embodiments may be employed in this embodiment and the detailed explanation may be omitted.

In this embodiment, the first conductive layer is not disposed over the upper surface of the WFA layer 90A'. During the formation of the WFA layer 90A', a gate space is fully filled by a material for the WFA layer and an etch-back operation is performed to recess the filled material for the WFA layer. Then, a second conductive layer 120A' is formed, followed by forming the third conductive layer 130A".

In Area B, the thickness of the WFA layer 90B' is greater than the case of the foregoing embodiments, for example, FIG. 15.

The height of the third conductive layer 130A" from a substrate is different from a height of the first conductive layer 100B in some embodiments. In other embodiments, the height of the third conductive layer 130A" is substantially the same as the height of the first conductive layer 100B, where the difference in heights is within about 2 nm.

It is understood that the devices shown in FIGS. 15, 20, 23 and 24 undergoes further CMOS processes to form various features such as interconnect conductive layers, dielectric layers, passivation layers, etc. In the above embodiment, the manufacturing operations for a Fin FET are described. However, the above manufacturing process may be applied to other types of FET, such as a planar type FET.

The various embodiments or examples described herein offer several advantages over the existing art. For example, in the present disclosure, sine the third conductive layer containing a metal material having a lower resistance than the WFA layers is deposited, the gate resistance can be reduced. Further, since the metal gate structure for a short channel FET and the metal gate structure for a long channel FET are separately formed, amounts of etching the WFA for the short channel FET and the long channel FET can be controlled.

It will be understood that not all advantages have been necessarily discussed herein, no particular advantage is required for all embodiments or examples, and other embodiments or examples may offer different advantages.

According to one aspect of the present disclosure, in a method of manufacturing a semiconductor device, a dummy gate structure is formed over a substrate. A first insulating layer is formed over the dummy gate structure. The dummy gate structure is removed so as to form a gate space in the first insulating layer. A first conductive layer is formed in the gate space so as to form a reduced gate space. The reduced gate space is filled with a second conductive layer made of a different material from the first conductive layer. The filled first conductive layer and the second conductive layer are recessed so as to form a first gate recess. A third conductive layer is formed over the first conductive layer and the second conductive layer in the first gate recess. After recessing the filled first conductive layer and the second conductive layer, the second conductive layer protrudes from the first conductive layer.

According to another aspect of the present disclosure, in a method of manufacturing a semiconductor device, a first dummy gate structure for a first field effect transistor (FET) having a gate length Lg1 is formed in a first region and a second dummy gate structure for a second FET having a gate length Lg2 is formed in a second region. Lg2 is greater than Lg1. A first insulating layer is formed over the first and second dummy gate structures. The first and second dummy gate structures are removed so as to form a first gate space and a second gate space, respectively, in the first insulating layer. A first first-conductive layer is formed in the first gate space so as to form a first reduced gate space, and a second first-conductive layer is formed in the first gate space so as to form a second reduced gate space. The first reduced gate space is filled with a first second-conductive layer made of a different material from the first first-conductive layer, and the second reduced gate space is filled with a second second-conductive layer made of a different material from the second first-conductive layer. The second region is covered with a mask layer. The filled first first-conductive layer and the first second-conductive layer are recessed so as to form a first gate recess, while the second region is covered with the mask layer. A third conductive layer is formed over the first first-conductive layer and the first second-conductive layer in the first gate recess, while the second region is covered with the mask layer. After forming the third conductive layer, the mask layer is removed. The third conductive layer in the first region and the second first-conductive layer and the second second-conductive layer in the second region are recessed.

In accordance with yet another aspect of the present disclosure, a semiconductor device includes a first field effect transistor (FET) including a first gate dielectric layer and a first gate electrode. The first gate electrode includes a first lower conductive layer, a first upper conductive layer and an intermediate conductive layer disposed between the first lower conductive layer and the first upper conductive layer. The first lower conductive layer includes a first underlying conductive layer in contact with the first gate dielectric layer and a first bulk conductive layer. The first bulk conductive layer protrudes from the first underlying conductive layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming a dummy gate structure over a substrate;
    forming a first insulating layer over the dummy gate structure, the dummy gate structure including a dummy gate electrode layer and sidewall spaces disposed on opposing side faces of the dummy gate electrode layer;
    removing the dummy gate electrode layer so as to form a gate space;
    forming a gate dielectric layer in the gate space and on a top of the sidewall spacers and on the first insulating layer;
    forming a first conductive layer on the gate dielectric layer in the gate space so as to form a reduced gate space;
    filling the reduced gate space with a second conductive layer made of a different material from the first conductive layer;
    removing the gate dielectric layer formed on the top of the sidewall spacers and on the first insulating layer;

after the gate dielectric layer is removed, recessing the filled first conductive layer and the second conductive layer so as to form a first gate recess; and
forming a third conductive layer over the first conductive layer and the second conductive layer in the first gate recess, wherein:
after recessing the filled first conductive layer and the second conductive layer, the second conductive layer protrudes from the first conductive layer, and
the method further comprises, between the removing the gate dielectric layer and the recessing the filled first conductive layer and the second conductive layer, recessing the first insulating layer, the sidewall spacers, the gate dielectric layer, and the first and second conductive layers.

2. The method of claim 1, further comprising forming a fourth conductive layer over the second conductive layer before forming the third conductive layer.

3. The method of claim 2, further comprising:
recessing the third conductive layer so as to form a second gate recess; and
forming a second insulating layer over the recessed third conductive layer in the second gate recess.

4. The method of claim 1, wherein a material of the second conductive layer is the same as a material of the third conductive layer.

5. The method of claim 1, wherein a material of the second conductive layer includes at least one of W, Co, Ti, Al, and Cu.

6. The method of claim 1, wherein a material of the first conductive layer includes at least one of TiN, Al, TaAlC and TiAl.

7. The method of claim 1, wherein a material of the fourth conductive layer includes at least one of TiN, TaN and Ti.

8. A method of manufacturing a semiconductor device, the method comprising:
forming a first dummy gate structure for a first field effect transistor (FET) having a gate length Lg1 in a first region and a second dummy gate structure for a second FET having a gate length Lg2 in a second region, Lg2 being greater than Lg1;
forming a first insulating layer over the first and second dummy gate structures;
removing the first and second dummy gate structures so as to form a first gate space and a second gate space, respectively, in the first insulating layer;
forming a first first-conductive layer in the first gate space so as to form a first reduced gate space and a second first-conductive layer in the second gate space so as to form a second reduced gate space;
filling the first reduced gate space with a first second-conductive layer made of a different material from the first first-conductive layer and the second reduced gate space with a second second-conductive layer made of a different material from the second first-conductive layer;
covering the second region with a mask layer;
recessing the filled first first-conductive layer and the first second-conductive layer so as to form a first gate recess, while the second region is covered with the mask layer;
forming a third conductive layer over the first first-conductive layer and the first second-conductive layer in the first gate recess, while the second region is covered with the mask layer;
after forming the third conductive layer, removing the mask layer; and
recessing the third conductive layer in the first region and the second first-conductive layer and the second second-conductive layer in the second region.

9. The method of claim 8, wherein after recessing the filled first first-conductive layer and the first second-conductive layer, the first second-conductive layer protrudes from the first first-conductive layer.

10. The method of claim 8, wherein after recessing the third conductive layer in the first region and the second first-conductive layer and the second second-conductive layer in the second region, the second second-conductive layer protrudes from the second first-conductive layer.

11. The method of claim 8, wherein after recessing the third conductive layer in the first region and the second first-conductive layer and the second second-conductive layer in the second region, a height of the recessed third conductive layer from a substrate is different from a height of the recessed second second-conductive layer from the substrate.

12. The method of claim 8, further comprising forming a fourth conductive layer over the first second-conductive layer before forming the third conductive layer.

13. The method of claim 8, further comprising, after recessing the third conductive layer in the first region and the second first-conductive layer and the second second-conductive layer in the second region, forming a second insulating layer over the recessed third conductive layer and the recessed second second-conductive layer and second first-conductive layer.

14. The method of claim 8, wherein a material of the first second-conductive layer is the same as a material of the third conductive layer.

15. The method of claim 8, wherein a material of the first and second second-conductive layers includes at least one of W, Co, Ti, Al, and Cu.

16. The method of claim 8, wherein a material of the first and second first-conductive layers includes at least one of TiN, Al, TaAlC and TiAl.

17. The method of claim 8, wherein a material of the fourth conductive layer includes at least one of TiN, TaN and Ti.

18. A semiconductor device comprising:
a first field effect transistor (FET) including a first gate dielectric layer and a first gate electrode, the first FET having a gate length Lg1; and
a second FET including a second gate dielectric layer and a second gate electrode, the second FET having a gate length Lg2 greater than Lg1, wherein:
the first gate electrode includes a first lower conductive layer, a first upper conductive layer and an intermediate conductive layer disposed between the first lower conductive layer and the first upper conductive layer,
the first lower conductive layer includes a first underlying conductive layer in contact with the first gate dielectric layer and a first bulk conductive layer,
the first bulk conductive layer protrudes from the first underlying conductive layer,
the second gate electrode includes a second underlying conductive layer and a second bulk conductive layer,
a bottom of the second underlying conductive layer is in contact with the second gate dielectric layer,
an insulating layer is provided in contact with an upper surface of the second underlying conductive layer and an upper surface of the second gate dielectric layer.

19. The semiconductor device of claim 18, wherein a height of the first upper conductive layer from a substrate is different from a height of the second bulk conductive layer from the substrate.

* * * * *